United States Patent
Lee et al.

(10) Patent No.: US 10,999,669 B2
(45) Date of Patent: May 4, 2021

(54) COMBINATORIAL INNER MODULE

(71) Applicant: CONCRAFT HOLDING CO., LTD., Grand Cayman (KY)

(72) Inventors: Chin-Hsing Lee, New Taipei (TW); Jin-Bo Peng, Kunshan (CN); Chang-Hsien Tung, New Taipei (TW)

(73) Assignee: CONCRAFT HOLDING CO., LTD., Grand Cayman (KY)

( * ) Notice: Subject to any disclaimer, the term of this patent is extended or adjusted under 35 U.S.C. 154(b) by 207 days.

(21) Appl. No.: 16/381,321

(22) Filed: Apr. 11, 2019

(65) Prior Publication Data

US 2020/0204897 A1 Jun. 25, 2020

(30) Foreign Application Priority Data

Dec. 20, 2018 (TW) .................................. 107146199

(51) Int. Cl.
*H04R 1/00* (2006.01)
*H04R 1/10* (2006.01)
*H05K 1/14* (2006.01)
*H05K 5/03* (2006.01)
*H05K 5/02* (2006.01)

(52) U.S. Cl.
CPC ......... *H04R 1/1016* (2013.01); *H04R 1/1041* (2013.01); *H04R 1/1075* (2013.01); *H05K 1/142* (2013.01); *H05K 5/0221* (2013.01); *H05K 5/03* (2013.01); *H04R 2420/07* (2013.01); *H05K 2201/10083* (2013.01)

(58) Field of Classification Search
CPC .. H04R 1/1016; H04R 1/1041; H04R 1/1075; H04R 2420/07; H05K 1/142; H05K 5/03; H05K 5/0221; H05K 2201/10083
See application file for complete search history.

(56) References Cited

U.S. PATENT DOCUMENTS

| | | | | |
|---|---|---|---|---|
| 8,605,919 | B2 * | 12/2013 | Awamura ............. | H04R 31/006 381/174 |
| 2008/0100732 | A1 * | 5/2008 | Minamio ............. | H04N 5/2257 348/294 |
| 2012/0307459 | A1 * | 12/2012 | Sakuma ................. | G01D 11/30 361/728 |
| 2014/0182376 | A1 * | 7/2014 | Watanabe ............. | G01C 25/00 73/510 |

* cited by examiner

*Primary Examiner* — Matthew A Eason
(74) *Attorney, Agent, or Firm* — Muncy, Geissler, Olds & Lowe, P.C.

(57) ABSTRACT

A combinatorial inner module is installed primarily inside a wireless earphone, including a circuit loop, a lower cover and an upper cover. The circuit loop is provided with a first circuit board and a second circuit board which is extended from the first circuit board. The upper cover is disposed above the lower cover to fix the first circuit board between the upper cover and the lower cover. Moreover, the upper cover includes a first side wall which is formed with an angle with respect to the lower cover and is used to install the second circuit board, forming an included angle between the second circuit board and the first circuit board. Therefore, the inner module is formed into a modularized design to simplify the assembly procedure of the wireless earphone, which reduces the labor cost in assembling the wireless earphone significantly.

10 Claims, 8 Drawing Sheets

COMBINATORIAL INNER MODULE

BACKGROUND OF THE INVENTION a) Field of the Invention

The present invention relates to a combinatorial inner module, and more particularly to an inner module which is installed inside a wireless earphone by a modularized design and is able to reduce the assembly cost significantly.

b) Description of the Prior Art

An earphone is connected to an electronic device, so as to transmit the sound played by that electronic device to a user's ears. An ordinary earphone includes a wired earphone and a wireless earphone (such as the AIRPODS issued by the Apple, Inc.), wherein the wired earphone is connected to the electronic device through a wire, and the wireless earphone is connected to the electronic device through a wireless communication technology such as Bluetooth.

As the wired earphone must use a wire to connect to the electronic device, the range of use is limited. In addition, the wired earphone can be pulled and stretched easily due to the existence of wire, and the wire can be easily intertwined upon collecting the wired earphone. On the other hand, as the wireless earphone transmits the sound through the wireless communication technology, the range of use is farther than that of the wired earphone, and is without the problem of easy pulling and stretching or intertwining of the wire. Therefore, the wireless earphone has been replacing the wired earphone gradually.

For an ordinary earphone, in addition to that its exterior is enclosed by a casing, the interior is usually provided with a circuit board, and a loudspeaker; whereas, the interior of the wireless earphone should be further provided with a battery, a microphone and a wireless communication module. As a wireless earphone has more internal parts, when the ordinary wireless earphone is being assembled, the circuit board, the loudspeaker, the battery, the microphone, and the wireless communication module should be installed and fixed inside the casing orderly. Therefore, it will require a lot of manpower to assemble the wireless earphone, which increases the labor cost. Furthermore, as the wireless earphone is small in size, the internal space of assembly is limited, which can easily damage the parts by carelessly assembling, thereby decreasing the yield of assembly.

Accordingly, the technical means and the object thereof to be solved by the present invention are the provision of a combinatorial inner module which is installed inside a wireless earphone by a modularized design and is able to reduce the assembly cost significantly.

SUMMARY OF THE INVENTION

The primary object of the present invention is to provide a combinatorial inner module, and more particularly to an inner module which is installed inside a wireless earphone by a modularized design and is able to reduce the assembly cost significantly.

To achieve the aforementioned object, the present invention discloses a combinatorial inner module, comprising a circuit loop, a lower cover and an upper cover. The circuit loop includes at least a first circuit board and at least a second circuit board which is extended from the first circuit board. The lower cover is used to install the first circuit board; whereas, the upper cover is disposed above the lower cover to fix the first circuit board between the upper cover and the lower cover. In addition, the upper cover includes at least a first side wall which is formed with an angle with respect to the lower cover. The first side wall is provided with a first positioning slot to accommodate the second circuit board, so that after the second circuit board is installed in the first positioning slot, a first included angle is formed between the second circuit board and the first circuit board, thereby forming a modularized design to the inner module to simplify the assembly procedure of the wireless earphone and reduce the labor cost in assembling the wireless earphone considerably.

In an embodiment, a first latching mechanism is further disposed between the second circuit board and the first positioning slot, allowing the second circuit board to be fixed in the first positioning slot through the first latching mechanism.

In an embodiment, the upper cover further includes a second side wall which is opposite to the first side wall, as well as a connecting wall which is connected between the first side wall and the second side wall, forming a holding space between the upper cover and the lower cover.

In an embodiment, the inner module is further provided with a power supply unit which is disposed in the holding space to connect electrically with the circuit loop.

In an embodiment, the inner module is further provided with a loudspeaker, and the connecting wall is further formed with a rabbet to install the loudspeaker which is connected electrically with the circuit loop.

In an embodiment, the circuit loop further includes a third circuit board which is extended from the first circuit board to oppose the second circuit board, and the second side wall of the upper cover is further provided with a second positioning slot to accommodate the third circuit board, so that after the third circuit board is installed in the second positioning slot, the third circuit board is opposite to the second circuit board, forming a second included angle between the third circuit board and the first circuit board.

In an embodiment, a second latching mechanism is further disposed between the third circuit board and the second positioning slot to latch the third circuit board and the second positioning together, allowing the third circuit board to be fixed in the second positioning slot through the second latching mechanism.

In an embodiment, the first circuit board is a hard circuit board; whereas, the second circuit board and the third circuit board are a soft circuit board respectively.

In an embodiment, a center location of the lower cover is further formed with a through-hole, so that when the first circuit board is installed on the lower cover, one surface of the first circuit board is protruded in the holding space and the other surface is exposed in the through-hole.

In an embodiment, a third latching mechanism is further disposed between the upper cover and the lower cover to latch the upper cover and the lower cover together.

In comparison to the prior arts, the combinatorial inner module, according to the present embodiment, is provided with following advantages that:
1. Through the upper cover and the lower cover, the circuit loop, the power supply unit and the loudspeaker can be integrated together in advance, forming a modularized inner module to reduce the labor cost in assembly significantly.
2. The shapes of the upper cover and the lower cover can be changed according to the configuration of the wireless earphone, so that the inner module can be applied to the wireless earphones in various configurations.

To enable a further understanding of the said objectives and the technological methods of the invention herein, the brief description of the drawings below is followed by the detailed description of the preferred embodiments.

DETAILED DESCRIPTION OF THE PREFERRED EMBODIMENTS

Figure 1:
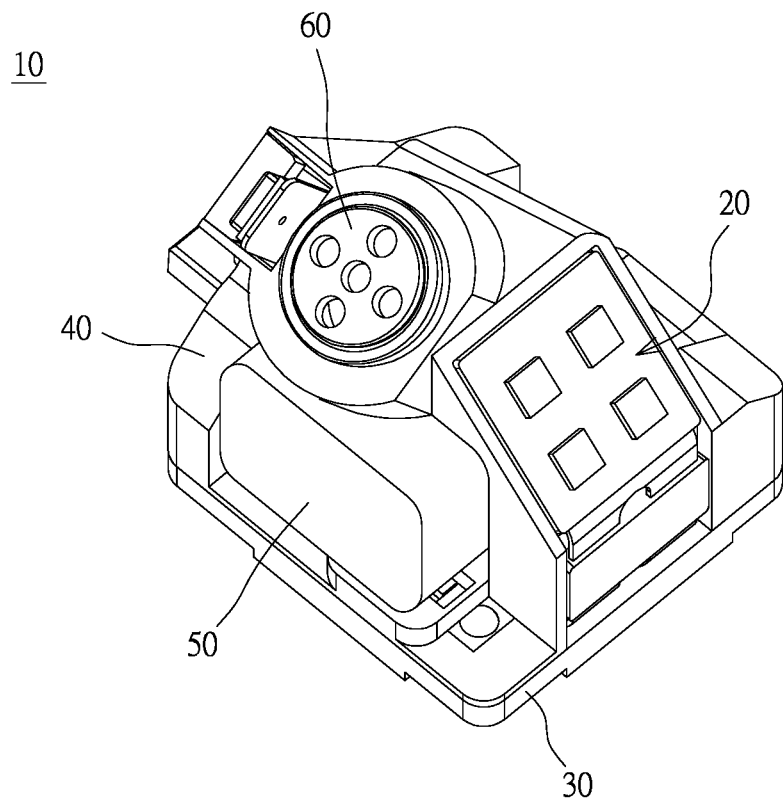
FIG. 1 shows a three-dimensional schematic view of the present invention.
Figure 2:
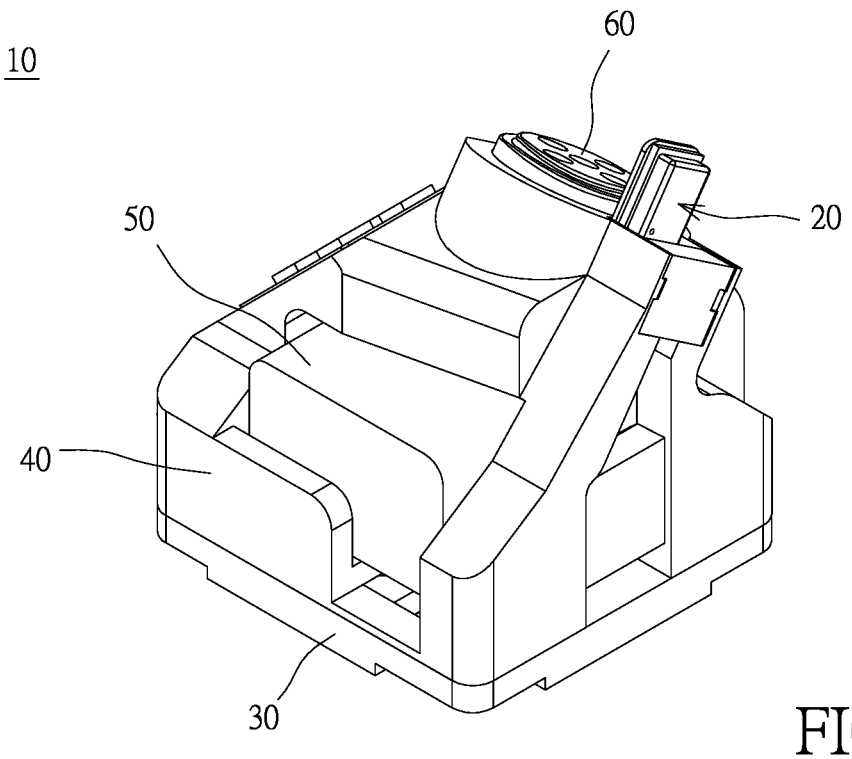
FIG. 2 shows a three-dimensional schematic view of the present invention at another viewing angle.
Figure 3:
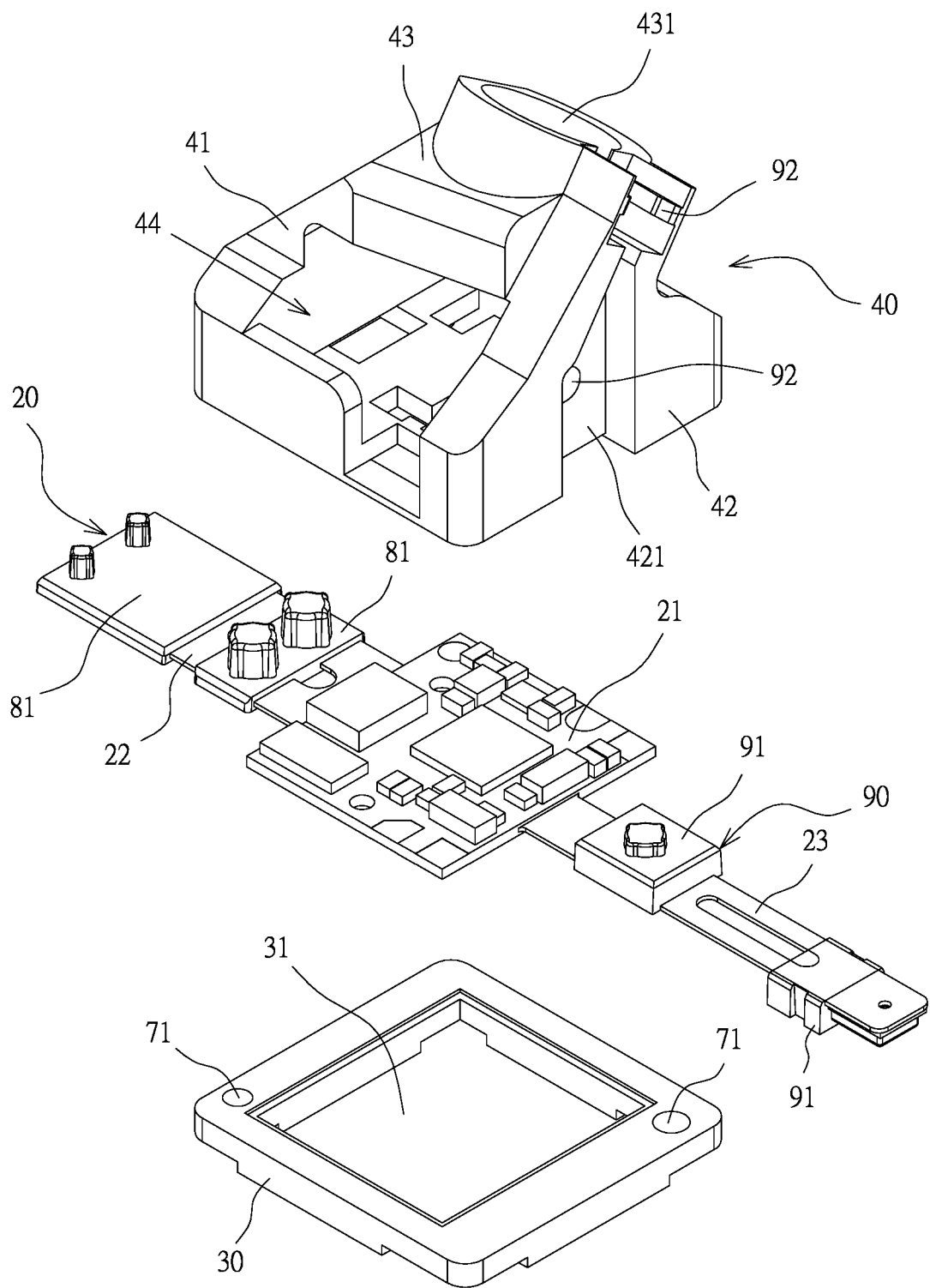
FIG. 3 shows an exploded view of the present invention.
Figure 4:
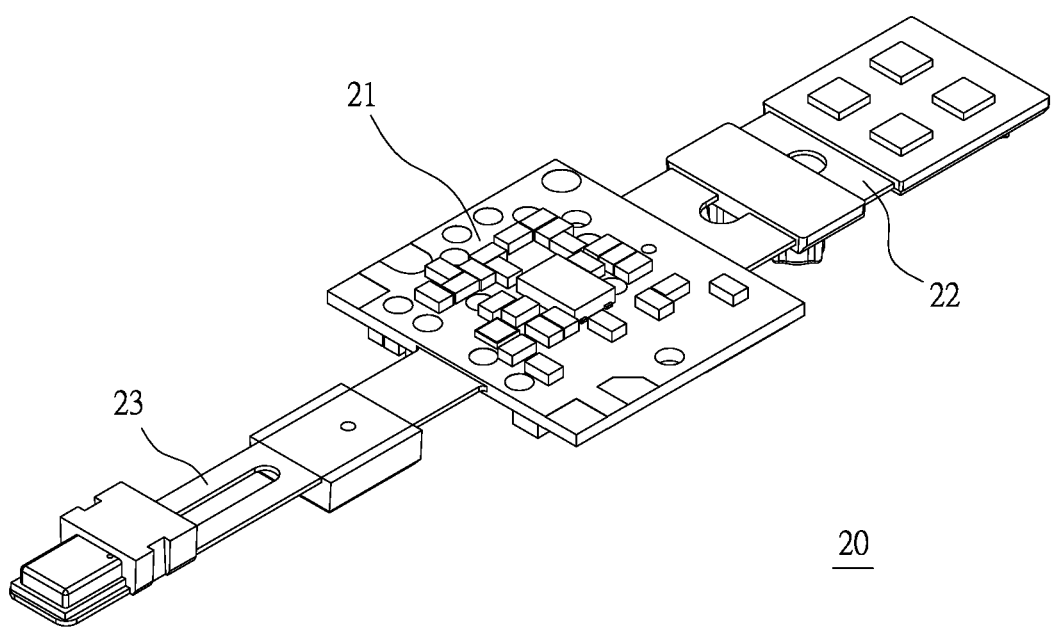
FIG. 4 shows a three-dimensional schematic view of a back part of circuit loop in the present invention.
Figure 5:
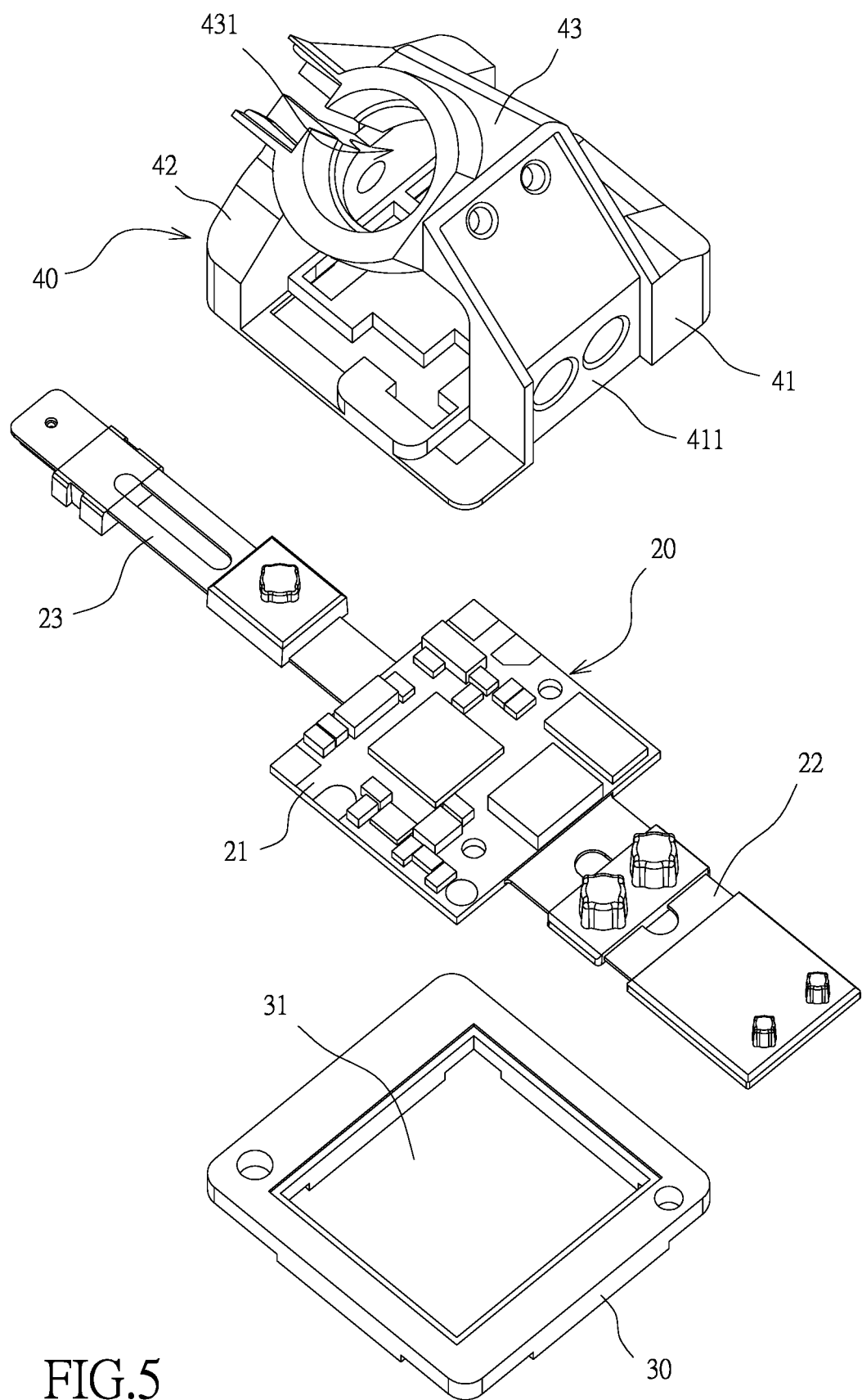
FIG. 5 shows an exploded view of the present invention at another viewing angle.

Referring to FIGS. 1 to 5, the present invention discloses a combinatorial inner module 10, comprising a circuit loop 20, a lower cover 30, an upper cover 40, a power supply unit 50 and a loudspeaker 60.

The circuit loop 20 is constituted by a first circuit board 21, a second circuit board 22 and a third circuit board 23. The first circuit board 21 is a hard circuit board; whereas, the second circuit board 22 and the third circuit board 23 are a soft circuit board respectively, and are extended from two opposite sides of the first circuit board 21, enabling the second circuit board 22 to oppose the third circuit board 23. In addition to that the circuit loop 20 is assembled by the hard circuit board and the soft circuit boards, the circuit loop 20 can be also formed by the soft circuit boards alone or the hard circuit boards alone. Furthermore, the first circuit board 21, the second circuit board 22 and the third circuit board 23 are connected with one another electrically.

The lower cover 30 is used to dispose the first circuit board 21, and a center location of the lower cover 30 is formed with a through-hole 31 which penetrates the lower cover 30.

The upper cover 40 is disposed above the lower cover 30 to fix the first circuit board 21 between the lower cover 30 and the upper cover 40, and the upper cover 40 includes a first side wall 41, a second side wall 42, and a connecting wall 43 which is connected between the first side wall 41 and the second side wall 42. The first side wall 41 is opposite to the second side wall 42, and when the upper cover 40 is disposed above the lower cover 30, a holding space 44 is formed between the lower cover 30 and the upper cover 40 to dispose the power supply unit 50. The first side wall 41 is further provided with a first positioning slot 411 to accommodate the second circuit board 22, and the second side wall 42 is further provided with a second positioning slot 421 to accommodate the third circuit board 23. Furthermore, the connecting wall 43 is provided with a rabbet 431 to dispose the loudspeaker 60.

Figure 6:
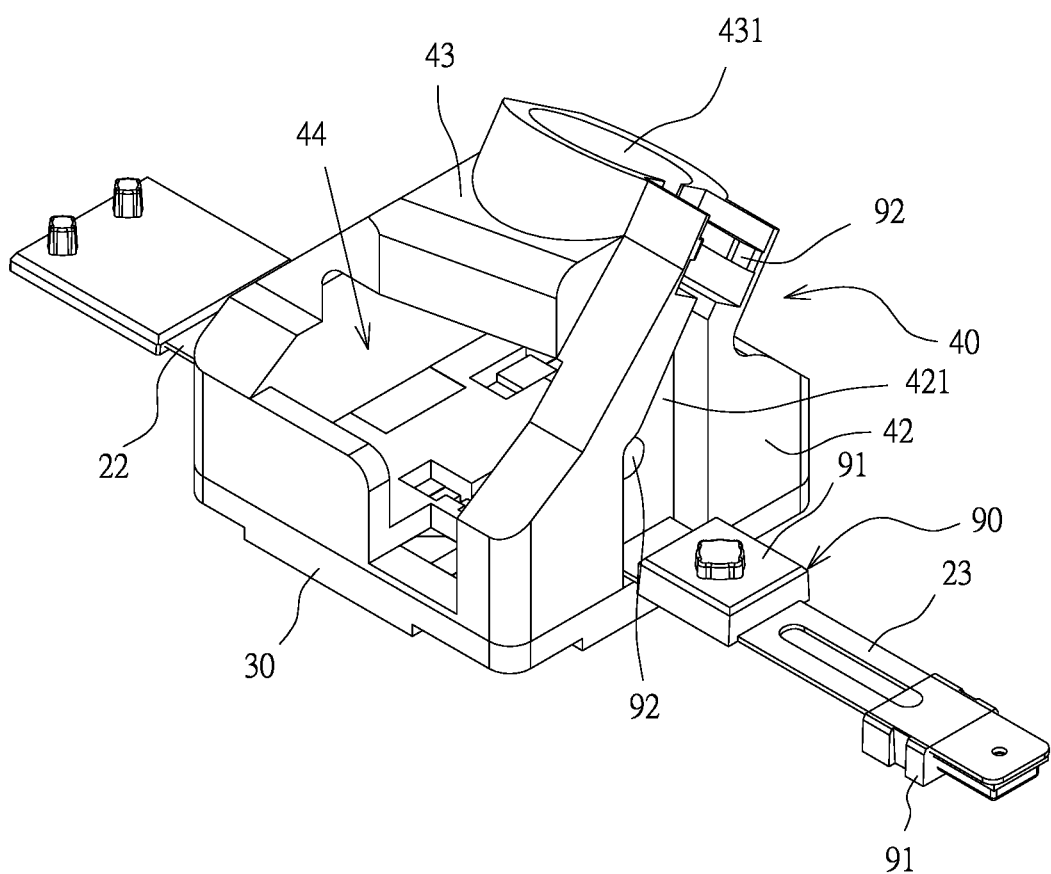
FIG. 6 shows a three-dimensional schematic view of the present invention after assembling an upper cover with a lower cover.
Figure 7:
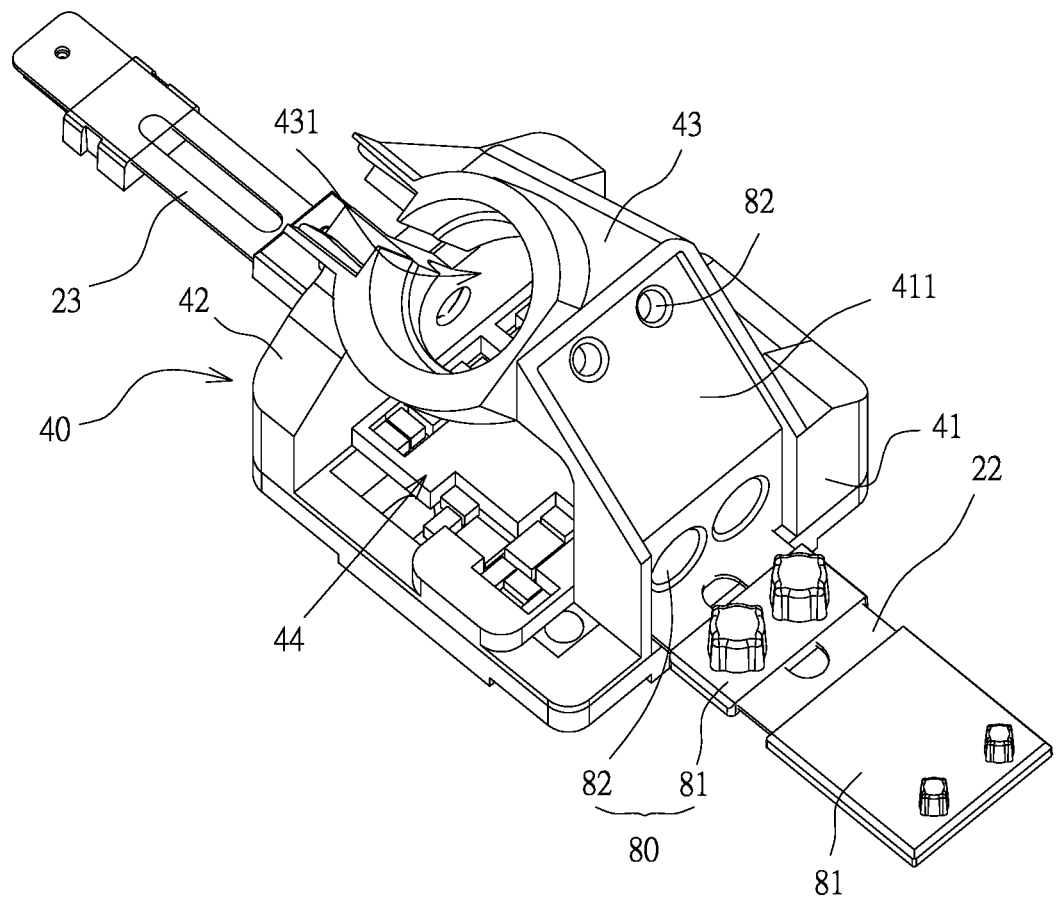
FIG. 7 shows a three-dimensional schematic of the present invention at another viewing angle after assembling the upper cover with the lower cover.
Figure 8:
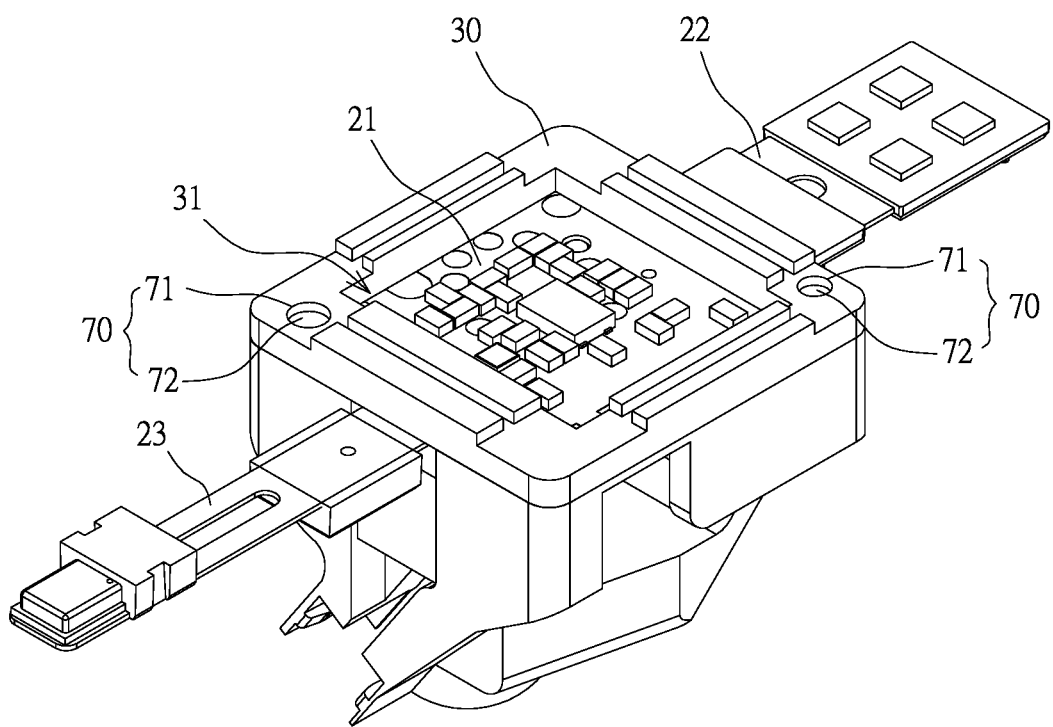
FIG. 8 shows a three-dimensional schematic view of a back part of the present invention after assembling the upper cover with the lower cover.
Figure 9:
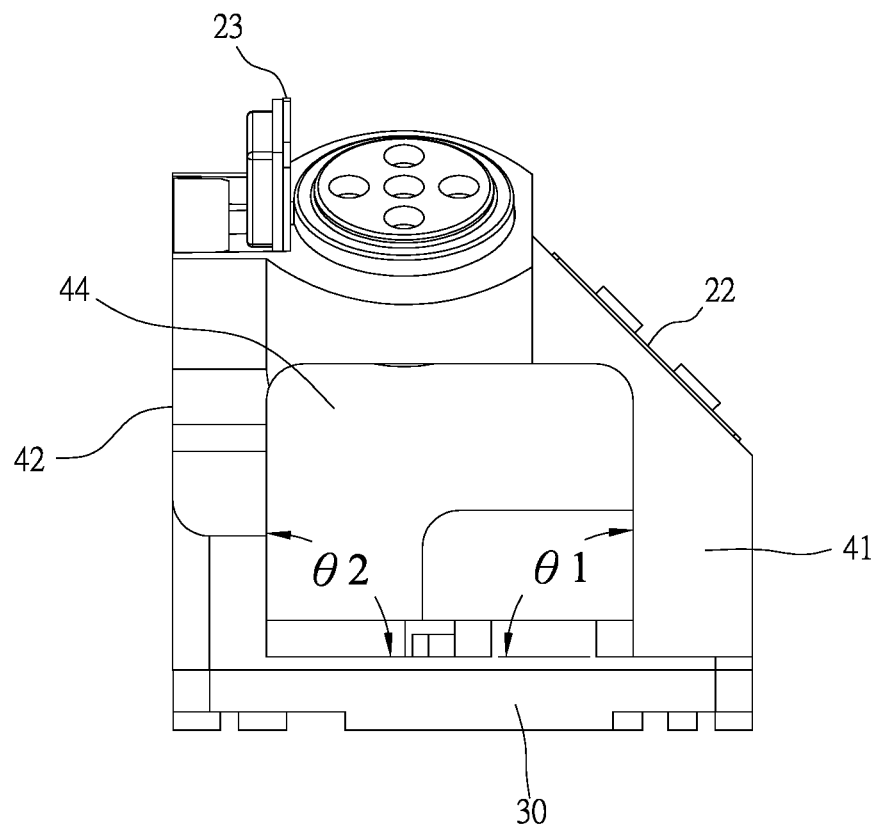
FIG. 9 shows a planar view of the present invention.

Referring to FIGS. 1 to 9, upon assembling, the first circuit board 21 is first installed on the lower cover 30, and then the upper cover 40 is installed on the lower cover 30, enabling one surface of the first circuit board 21 to be exposed in the holding space 44, and the other surface to be exposed in the through-hole 31. In order to achieve a good latching effect between the lower cover 30 and the upper cover 40, at least a third latching mechanism 70 is disposed between the lower cover 30 and the upper cover 40 to latch the lower cover 30 and the upper cover 40 together. In the present embodiment, two third latching mechanisms 70 are disposed between the lower cover 30 and the upper cover 40. The third latching mechanism 70 includes at least a third latching groove 71 which is concaved on the lower cover 30 and a third latching bump 72 which is protruded on the upper cover 40 to oppose the third latching groove 71. The third latching groove 71 and the third latching bump 72 are latched together by tight fitting or interference, so that the lower cover 30 and the upper cover 40 can be latched together effectively, and the second circuit board 22 and the third circuit board 23 can be extended to two sides of the lower cover 30 and the upper cover 40 after assembling.

Next, the second circuit board 22 and the third circuit board 23 are bent over orderly with respect to the first circuit board 21, followed by being installed in the first positioning slot 411 and the second positioning slot 421 respectively. In order to allow the second circuit board 22 and the third circuit board 23 to be actually installed in the first positioning slot 411 and the second positioning slot 421, at least a first latching mechanism 80 is disposed between the second circuit board 22 and the first positioning slot 411 to latch the second circuit board 22 and the first positioning slot 411 together (in the present embodiment, two first latching mechanisms 80 are disposed between the second circuit board 22 and the first positioning slot 411), and at least a second latching mechanism 90 is disposed between the third circuit board 23 and the second positioning slot 421 to latch the third circuit board 23 and the second positioning slot 421 together (in the present embodiment, two second latching mechanisms 90 are disposed between the third circuit board 23 and the second positioning slot 421). Each first latching mechanism 80 includes at least a first latching bump 81 which is protruded on the second circuit board 22, and at least a first latching groove 82 which is concaved in the first positioning slot 411 to oppose the first latching bump 81. Each second latching mechanism 90 includes at least a second latching bump 91 which is protruded on the third circuit board 23, and at least a second latching groove 92 which is concaved in the second positioning slot 421 to oppose the second latching bump 91. In addition, the first latching mechanism 80 and the second latching mechanism 90 are latched together by tight fitting or interference, so that the second circuit board 22 and the third circuit board 23 can be fixed effectively in the first positioning slot 411 and the second positioning slot 421, respectively. On the other hand, the first latching bump 81 and the second latching bump 91 are directly formed on the second circuit board 22 and the third circuit board 23 by injection molding. Accordingly, the steps and procedure for assembling the second circuit board 22 and the third circuit board 23 with the first positioning slot 411 and the second positioning slot 421 can be reduced significantly. In addition, when the upper cover 40 is disposed on the lower cover 30, an angle is formed between the first side wall 41 and the lower cover 30 as well as between the second side wall 42 and the lower cover 30, enabling a first included angle θ1 to be formed between the second circuit board 22 and the first circuit board 21, and a second included angle 02 to be formed between the third circuit board 23 and the first circuit board 21.

Finally, the loudspeaker 60 is installed in the rabbet 431 of the connecting wall 43, and is made to connect electrically with the first circuit board 21 of the circuit loop 20. Next, the power supply unit 50 is installed in the holding space 44, and is made to connect electrically with the first circuit board 21 of the circuit loop 20. Accordingly, the inner module 10 in the modularized design is accomplished. Furthermore, when the inner module 10 is installed in a casing of the wireless earphone (not shown in the drawings), the wireless earphone is assembled only by installing the modularized inner module 10 in the casing directly, which simplifies the assembly procedure of the wireless earphone considerably and decreases the manpower in assembling significantly, thereby reducing the assembly cost.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A combinatorial inner module comprising
a circuit loop, which is provided with a first circuit board, as well as a second circuit board extending from the first circuit board;
a lower cover which is used to install the first circuit board; and
an upper cover, which is disposed above the lower cover to fix the first circuit board between the upper cover and the lower cover, with the upper cover being provided with a first side wall forming an angle with respect to the lower cover, and the first side wall being provided with a first positioning slot to accommodate the second circuit board, forming a first included angle between the second circuit board and the first circuit board after installing the second circuit board in the first positioning slot.

2. The combinatorial inner module according to claim 1, wherein a first latching mechanism is further disposed between the second circuit board and the first positioning slot to latch the second circuit board and the first positioning slot together, allowing the second circuit board to be fixed in the first positioning slot through the first latching mechanism.

3. The combinatorial inner module according to claim 1, wherein the upper cover further includes a second side wall which is opposite to the first side wall as well as a connecting wall which is connected between the first side wall and the second side wall, forming a holding space between the upper cover and the lower cover.

4. The combinatorial inner module according to claim 3, wherein the inner module further includes a power supply unit which is disposed in the holding space, with the power supply unit being connected electrically with the circuit loop.

5. The combinatorial inner module according to claim 3, wherein the inner module further includes a loudspeaker and the connecting wall is further formed with a rabbet to dispose the loudspeaker which is connected electrically with the circuit loop.

6. The combinatorial inner module according to claim 3, wherein the circuit loop further includes a third circuit board which is extended from the first circuit board to oppose the second circuit board, and the second side wall of the upper cover further includes a second positioning slot to accommodate the third circuit board, enabling the third circuit board to oppose the second circuit board and forming a second included angle between the third circuit board and the first circuit board after installing the third circuit board in the second positioning slot.

7. The combinatorial inner module according to claim 6, wherein a second latching mechanism is further disposed between the third circuit board and the second positioning slot to latch the third circuit board and the second positioning slot together, allowing the third circuit board to be fixed in the second positioning slot through the second latching mechanism.

8. The combinatorial inner module according to claim 6, wherein the first circuit board is a hard circuit board, and the second circuit board and the third circuit board are a soft circuit board respectively.

9. The combinatorial inner module according to claim 3, wherein a center location of the lower cover is further formed with a through-hole, so that when the first circuit board is installed on the lower cover, one surface of the first circuit board is protruded in the holding space and the other surface is exposed in the through-hole.

10. The combinatorial inner module according to claim 1, wherein a third latching mechanism is further disposed between the upper cover and the lower cover to latch the upper cover and the lower cover together.

* * * * *